US009024287B2

(12) United States Patent
Ishikawa et al.

(10) Patent No.: US 9,024,287 B2
(45) Date of Patent: May 5, 2015

(54) MEMORY DEVICE

(71) Applicant: Kabushiki Kaisha Toshiba, Minato-ku (JP)

(72) Inventors: Takayuki Ishikawa, Yokkaichi (JP); Hiroki Tanaka, Yokohama (JP); Shosuke Fujii, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/453,781

(22) Filed: Aug. 7, 2014

(65) Prior Publication Data

US 2015/0076440 A1    Mar. 19, 2015

(30) Foreign Application Priority Data

Sep. 17, 2013   (JP) ................. 2013-192382

(51) Int. Cl.
*H01L 45/02*    (2006.01)
*H01L 45/00*    (2006.01)

(52) U.S. Cl.
CPC .......... *H01L 45/085* (2013.01); *H01L 45/1266* (2013.01); *H01L 45/145* (2013.01)

(58) Field of Classification Search
CPC . H01L 21/4763; H01L 21/8236; H01L 29/40; H01L 45/002; H01L 45/142; H01L 45/146; H01L 45/162; H01L 45/1233; H01L 45/1266
USPC ............. 257/2–4, E21.495, 29.111, 45.002–3
See application file for complete search history.

(56) References Cited

U.S. PATENT DOCUMENTS

| 8,598,560 | B1 * | 12/2013 | Milojevic et al. ................. 257/2 |
| 2008/0232153 | A1 | 9/2008 | Naitoh et al. |
| 2009/0014707 | A1 | 1/2009 | Lu et al. |
| 2009/0173930 | A1 * | 7/2009 | Yasuda et al. ..................... 257/4 |
| 2009/0251199 | A1 | 10/2009 | Naitoh et al. |
| 2010/0109085 | A1 * | 5/2010 | Kim et al. ..................... 257/364 |
| 2010/0187493 | A1 * | 7/2010 | Takahashi ........................ 257/4 |
| 2011/0198554 | A1 | 8/2011 | Iijima et al. |
| 2013/0037776 | A1 * | 2/2013 | Nishi et al. ........................ 257/3 |
| 2013/0075686 | A1 * | 3/2013 | Kawasaki ......................... 257/4 |
| 2013/0092894 | A1 * | 4/2013 | Sills et al. ......................... 257/4 |
| 2013/0175494 | A1 * | 7/2013 | Collins et al. ..................... 257/4 |
| 2013/0306930 | A1 * | 11/2013 | Sills .................................. 257/4 |
| 2014/0003130 | A1 | 1/2014 | Ichihara et al. |
| 2014/0284544 | A1 * | 9/2014 | Miyagawa et al. .............. 257/4 |
| 2014/0319442 | A1 | 10/2014 | Hayashi |

FOREIGN PATENT DOCUMENTS

JP   2007-123828   5/2007
JP   2008-218541   9/2008

(Continued)

*Primary Examiner* — Michael Lebentritt
(74) *Attorney, Agent, or Firm* — Oblon, McClelland, Maier & Neustadt, L.L.P.

(57) ABSTRACT

According to one embodiment, a memory device includes a first electrode, a second electrode and an insulating portion. The first electrode includes an ionizable metal. The second electrode includes a conductive material. The conductive material is more difficult to ionize than the metal. The insulating portion is provided between the first electrode and the second electrode. The insulating portion is made of an insulating material. A space is adjacent to a side surface of the insulating portion between the first electrode and the second electrode.

13 Claims, 14 Drawing Sheets

(56) References Cited

FOREIGN PATENT DOCUMENTS

| JP | 2008-235816 | 10/2008 |
| JP | 2008-243986 | 10/2008 |
| JP | 2010-80735 | 4/2010 |
| JP | 2011-171393 | 9/2011 |
| JP | 2012-203926 | 10/2012 |
| JP | 2014-216553 A | 11/2014 |
| WO | WO 2007/069725 A1 | 6/2007 |

* cited by examiner

MEMORY DEVICE

CROSS-REFERENCE TO RELATED APPLICATIONS

This application is based upon and claims the benefit of priority from Japanese Patent Application No. 2013-192382, filed on Sep. 17, 2013; the entire contents of which are incorporated herein by reference.

FIELD

Embodiments described herein relate generally to a memory device.

BACKGROUND

Resistive random access memory (ReRAM) is nonvolatile memory in which a memory element unit has a two-terminal structure including a variable resistance layer interposed between two electrodes. Scaling is considered to be easy because the cell structure is simpler than those of other memory. Therefore, resistive random access memory is drawing attention as a strong candidate for a next-generation large-capacity memory device to replace NAND flash memory which is used widely as large-capacity semiconductor memory devices in products.

Various materials such as transition metal oxides, sulfides, perovskite oxides, semiconductor materials, etc., are being studied as the material of the variable resistance layer of resistive random access memory. Among these, a memory device in which a semiconductor material such as amorphous silicon, etc., is included in the material of the variable resistance layer is expected to be employed due to a high affinity with CMOS processes. However, such a memory device is problematic in that the retention characteristics of the program state are insufficient, etc.; and stable operations cannot be realized.

BRIEF DESCRIPTION OF THE DRAWINGS

FIG. 2A shows a programming operation, and FIG. 2B shows an erasing operation;

FIG. 6A shows a programming operation, and FIG. 6B shows an erasing operation;

DETAILED DESCRIPTION

In general, according to one embodiment, a memory device includes a first electrode, a second electrode and an insulating portion. The first electrode includes an ionizable metal. The second electrode includes a conductive material. The conductive material is more difficult to ionize than the metal. The insulating portion is provided between the first electrode and the second electrode. The insulating portion is made of an insulating material. A space is adjacent to a side surface of the insulating portion between the first electrode and the second electrode.

Embodiments of the invention will now be described with reference to the drawings.

First Embodiment

Figure 1:
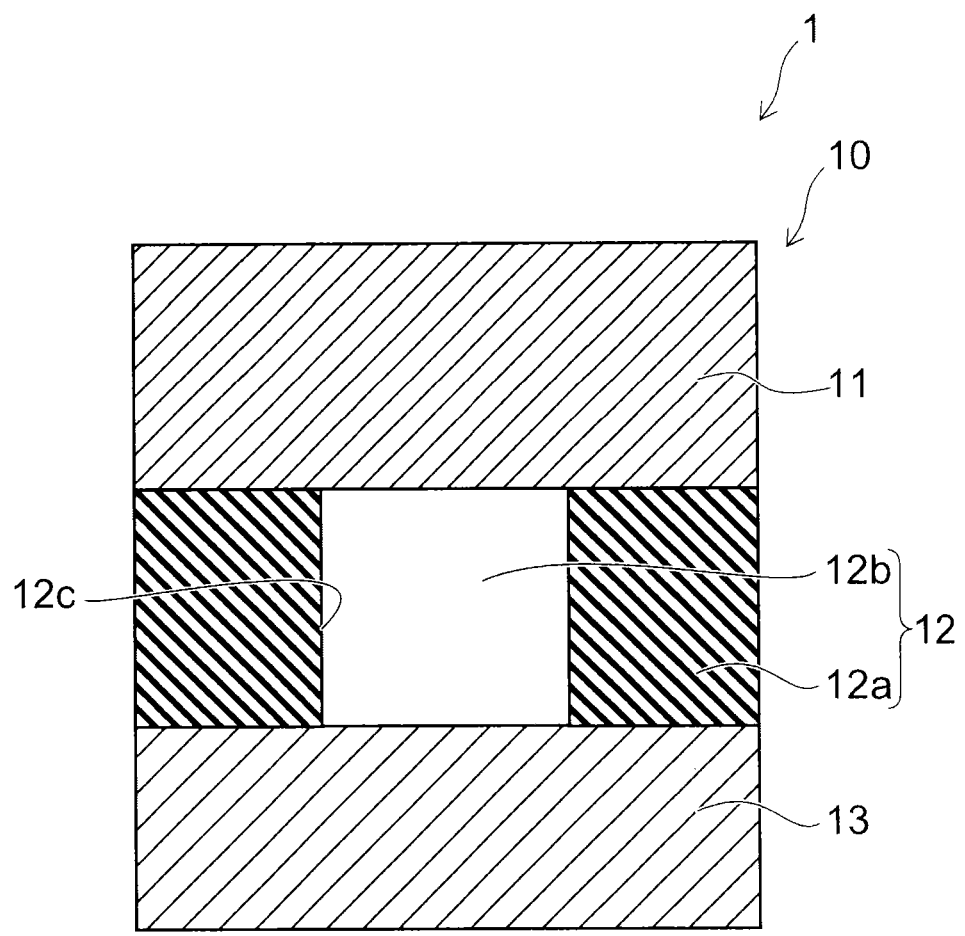
FIG. 1 is a cross-sectional view showing a memory device according to a first embodiment.

FIG. 1 is a cross-sectional view showing a memory device according to the embodiment.

In the memory device 1 according to the embodiment as shown in FIG. 1, an ion source electrode 11 and an opposing electrode 13 are provided; and an insulating layer 12 is provided between the ion source electrode 11 and the opposing electrode 13. In the insulating layer 12, an insulating portion 12a that is made of an insulating material is provided; and a space 12b is made between parts of the insulating portion 12a. In other words, the space 12b is made adjacent to a side surface 12c of the insulating portion 12a between the ion source electrode 11 and the opposing electrode 13. The insulating portion 12a and the space 12b are disposed continuously between the ion source electrode 11 and the opposing electrode 13. Therefore, the side surface 12c of the insulating portion 12a that faces the space 12b, i.e., the interface between the insulating portion 12a which is a solid phase portion and the space 12b which is a vapor phase portion, is formed continuously from the ion source electrode 11 to the opposing electrode 13. A resistance change element 10 is formed of the ion source electrode 11, the insulating layer 12, and the opposing electrode 13.

The insulating material of the insulating portion 12a is, for example, a material including silicon (Si) and is a material including, other than silicon, for example, at least one selected from oxygen (O) and nitrogen (N). Silicon oxide (SiO), silicon oxynitride (SiON), silicon nitride (SiN), etc., which are used as the material of inter-layer insulating films in CMOS processes are examples of such a material. It is favorable for silicon and nitrogen to be included in the insulating material of the insulating portion 12a to decrease the ion conduction of the insulating portion 12a and increase the insulative properties of the insulating portion 12a. In the embodiment, the insulating portion 12a is formed of silicon oxide containing nitrogen. Although it is favorable for the interior of the space 12b to be a vacuum, the interior may be filled with a nonoxidative gas such as nitrogen, etc.

The material of the ion source electrode 11 includes a metal material that is easy to ionize. For example, silver (Ag), copper (Cu), cobalt (Co), nickel (Ni), titanium (Ti), aluminum (Al), gold (Au), or the like is used. In the embodiment, the ion source electrode 11 is formed of silver. The material of the opposing electrode 13 includes an inert conductive material that is more difficult to ionize than the material of the ion source electrode 11. For example, a metal such as tungsten (W), platinum (Pt), tantalum (Ta), molybdenum (Mo), etc., or a metal nitride such as titanium nitride (TiN), tantalum nitride (TaN), tungsten nitride (WN), etc., may be used; and a semiconductor material in which an impurity is doped at a high concentration, e.g., high-concentration doped silicon, high-concentration doped germanium, etc., may be used.

Operations of the memory device 1 will now be described.

Figure 2A:
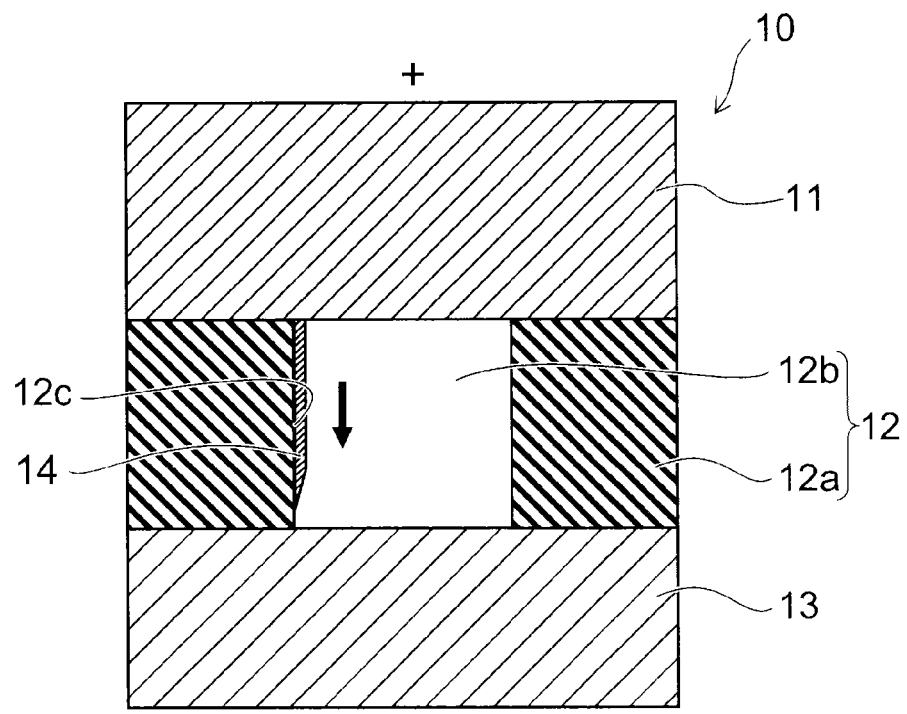
FIGS. 2A and 2B are cross-sectional views showing operations of the memory device according to the first embodiment.
Figure 2B:
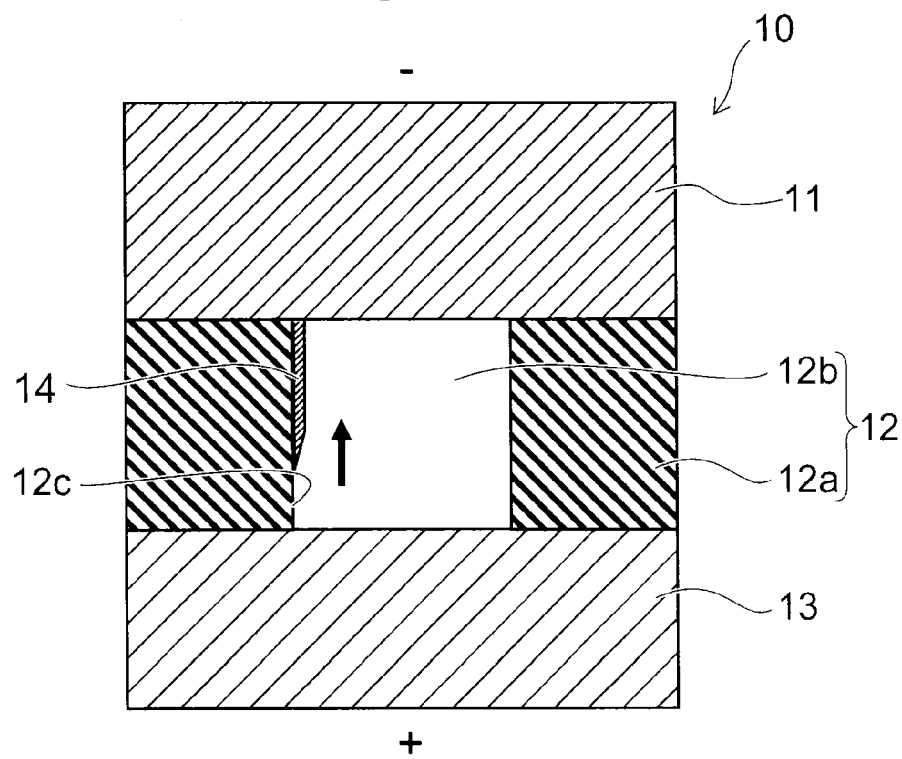

FIGS. 2A and 2B are cross-sectional views showing operations of the memory device according to the embodiment; FIG. 2A shows a programming operation; and FIG. 2B shows an erasing operation.

The resistance change element 10 is an element in which the electrical resistance of the insulating layer 12 changes due to the application of a voltage; the insulating layer 12 transitions from a high resistance state to a low resistance state due to the application of a programming voltage; and the insulating layer 12 transitions from the low resistance state to the high resistance state due to the application of an erasing voltage. The resistance change element 10 is a resistance change element having a so-called bipolar operation in which the application direction of the programming voltage is oriented reversely to the application direction of the erasing voltage.

The programming operation of the resistance change element 10 will now be described.

As shown in FIG. 2A, a prescribed forward voltage that causes the ion source electrode 11 to be positive and the opposing electrode 13 to be negative is applied as a programming voltage to the resistance change element 10. Thereby, the metal atoms, e.g., the silver atoms, that are included in the ion source electrode 11 are ionized and move toward the opposing electrode 13 over the side surface 12c of the insulating portion 12a facing the space 12b. On the other hand, electrons move over the side surface 12c from the opposing electrode 13 toward the ion source electrode 11. Then, the silver ions precipitate as simple silver atoms on the side surface 12c by combining with the electrons. Thereby, a filament 14 that is made of silver is formed. At this time, the filament 14 extends toward the opposing electrode 13 with the ion source electrode 11 as the starting point because the mobility of the electrons over the side surface 12c is higher than the mobility of the silver ions over the side surface 12c. Then, the resistance change element 10 is switched to the low resistance state when the filament 14 reaches the opposing electrode 13.

The erasing operation of the resistance change element 10 will now be described.

As shown in FIG. 2B, a prescribed reverse voltage that causes the ion source electrode 11 to be negative and the opposing electrode 13 to be positive is applied as an erasing voltage to the resistance change element 10. Thereby, the metal atoms, e.g., the silver atoms, that are included in the filament 14 are ionized and move toward the ion source electrode 11 over of the side surface 12c. At this time, the silver atoms of the tip portion of the filament 14, i.e., the end portion on the opposing electrode 13 side, are ionized preferentially because the electric field concentrates at this portion. Therefore, the filament 14 shrinks toward the ion source electrode 11. Thereby, at least a portion of the filament disappears; and the resistance change element 10 is switched to the high resistance state due to the insulation from the opposing electrode 13.

A read-out operation will now be described.

A forward voltage that causes the ion source electrode 11 to be positive and the opposing electrode 13 to be negative and is lower than the programming voltage is applied to the resistance change element 10. Then, the insulating layer 12 is determined to be in the low resistance state or in the high resistance state by sensing the amount of current flowing in the insulating layer 12.

Effects of the embodiment will now be described.

In the memory device 1 according to the embodiment as described above, the filament 14 is formed on the side surface 12c of the insulating portion 12a of the insulating layer 12. Therefore, compared to the case where the filament 14 is formed inside the insulating portion 12a, it is unnecessary to push aside the atoms of the insulating portion 12a when the filament 14 is formed. As a result, a thick filament 14 can be formed easily without the filament 14 being subjected to a reaction force from the insulating portion 12a. Also, because the filament 14 after being formed is not subjected to the reaction force from the insulating portion 12a, the filament 14 does not break easily; and it is easy to maintain the low resistance state.

In the case where the filament 14 is formed inside the insulating portion 12a, there is a possibility that the insulating portion 12a may be damaged and the characteristics may degrade by repeatedly forming the filament 14. Conversely, because the filament 14 is formed on the side surface 12c of the insulating portion 12a in the embodiment, the insulating portion 12a is not easily damaged because the strength of the electric field applied to the insulating portion 12a is low and the amount of the metallic element penetrating into the insulating portion 12a is low. Therefore, the characteristics of the resistance change element 10 do not degrade easily.

Further, in the embodiment, because the insulating portion 12a is formed of a material including silicon and nitrogen, the conduction of the metal ions in the interior of the insulating portion 12a can be suppressed more effectively. Thereby, the filament can be prevented with higher certainty from forming in the interior of the insulating portion 12a. Because the conduction of the metal ions at the side surface 12c also can be suppressed, the filament 14 can be elongated reliably from the ion source electrode 11 toward the opposing electrode 13 in the programming operation. As a result, the programming operation described above can be realized reliably.

Conversely, if the insulating portion 12a is formed of an ion conductive material instead of an insulating material, the filament is formed undesirably in the interior of the insulating portion 12a instead of on the side surface 12c. Even in the case of being formed on the side surface 12c, the filament undesirably elongates from the opposing electrode 13 toward the ion source electrode 11. Therefore, the programming operation described above cannot be realized.

A test example of the embodiment will now be described.

Figure 3:
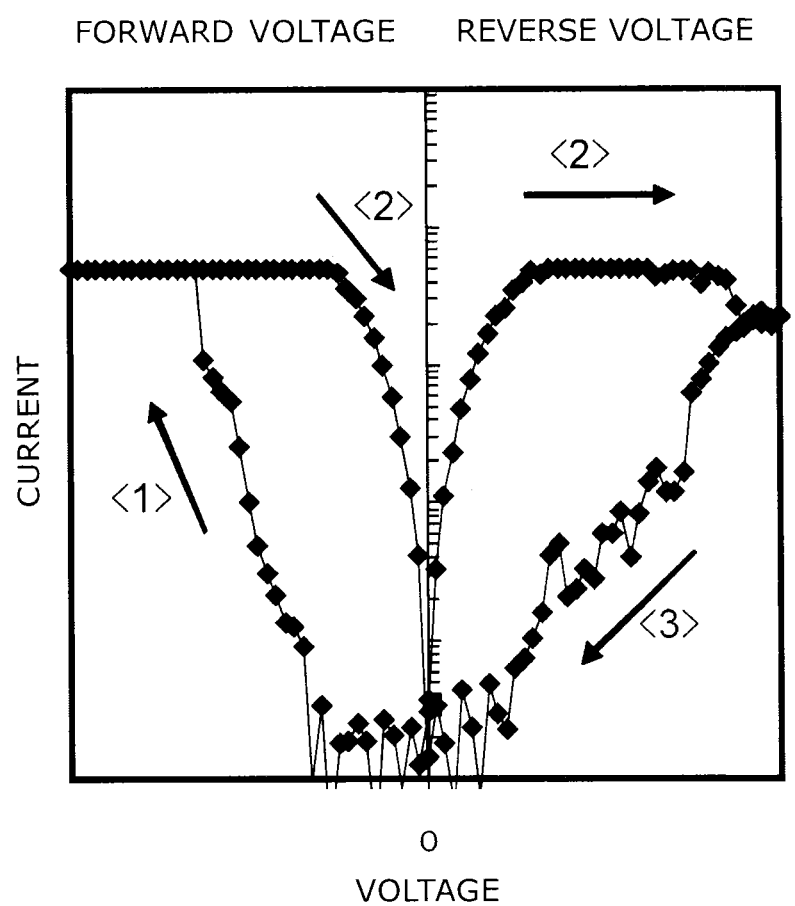
FIG. 3 is a graph showing the current-voltage characteristics of a resistance change element, where the horizontal axis is the voltage, and the vertical axis is the current.

FIG. 3 is a graph showing the current-voltage characteristics of the resistance change element, where the horizontal axis is the voltage, and the vertical axis is the current.

Figure 4A:
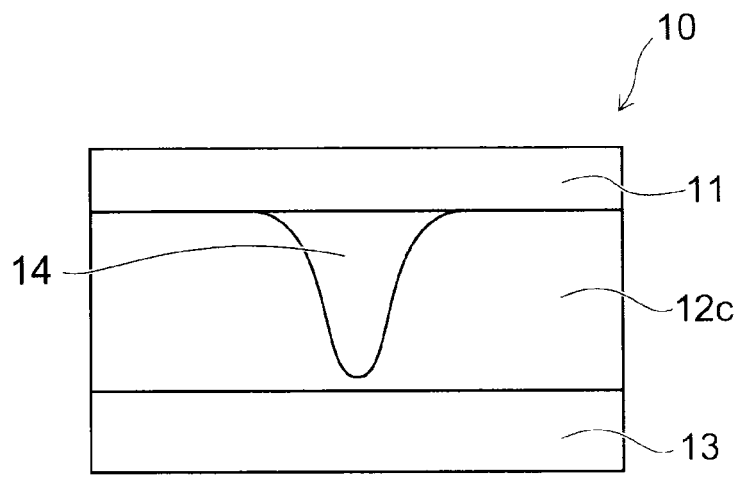
FIGS. 4A to 4C show tracings of TEM photographs of the resistance change element in every states.
Figure 4B:
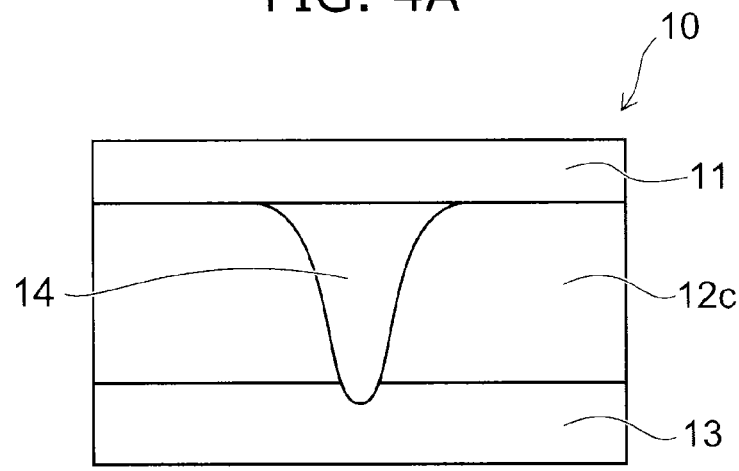
Figure 4C:
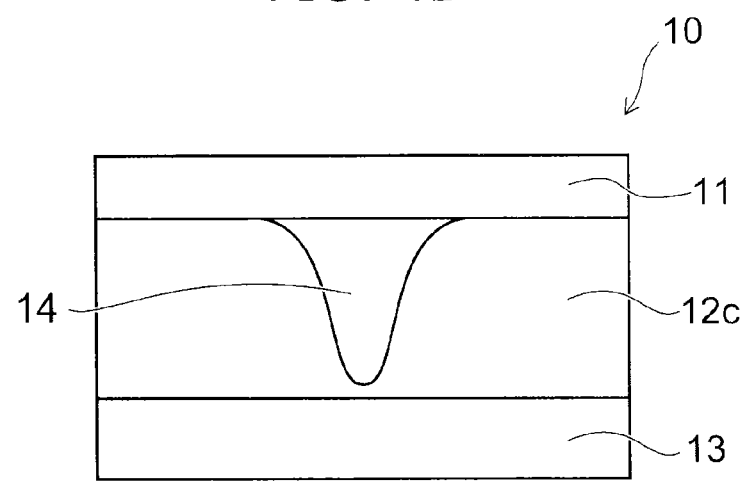

FIGS. 4A to 4C show tracings of TEM photographs of the resistance change element.

The vertical axis of FIG. 3 is logarithmic.

In the test example, the resistance change element 10 was made by forming the ion source electrode 11 of silver, forming the insulating portion 12a of silicon oxide including nitrogen, and forming the opposing electrode 13 of silicon containing an impurity at a high concentration; and the current-voltage characteristics were measured. The states of the resistance change element 10 were observed by TEM of the side surface 12c of the insulating portion 12a from the space 12b side.

As shown in process <1> of FIG. 3, a forward voltage causing the ion source electrode 11 to be positive was applied to the resistance change element 10 which was in the high resistance state; and the voltage was increased continuously.

At this time, as shown in FIG. 4A, the filament 14 extended from the ion source electrode 11 side but did not reach the opposing electrode 13. Then, when the forward voltage reached a constant value, the resistance change element 10 transitioned to the low resistance state. At this time, as shown in FIG. 4B, the filament 14 had reached the opposing electrode 13.

Then, as shown in process <2> of FIG. 3, the forward voltage that was applied to the resistance change element 10 was reduced continuously to zero; and subsequently, a reverse voltage causing the ion source electrode 11 to be negative was increased continuously. Meanwhile, the resistance change element 10 remained in the low resistance state. Then, when the reverse voltage reached a constant value, the resistance change element 10 transitioned to the high resistance state. At this time, as shown in FIG. 4C, the filament 14 was separated from the opposing electrode 13.

Continuing as shown in process <3> of FIG. 3, the reverse voltage that was applied to the resistance change element 10 was reduced continuously to zero. Meanwhile, the resistance change element 10 remained in the high resistance state.

Thus, according to the test example, it was confirmed that the filament 14 grows from the ion source electrode 11; the state switches to the low resistance state when the tip portion of the filament 14 reaches the opposing electrode 13; and the state switches to the high resistance state when the tip portion of the filament 14 is separated from the opposing electrode 13.

Second Embodiment

Figure 5:
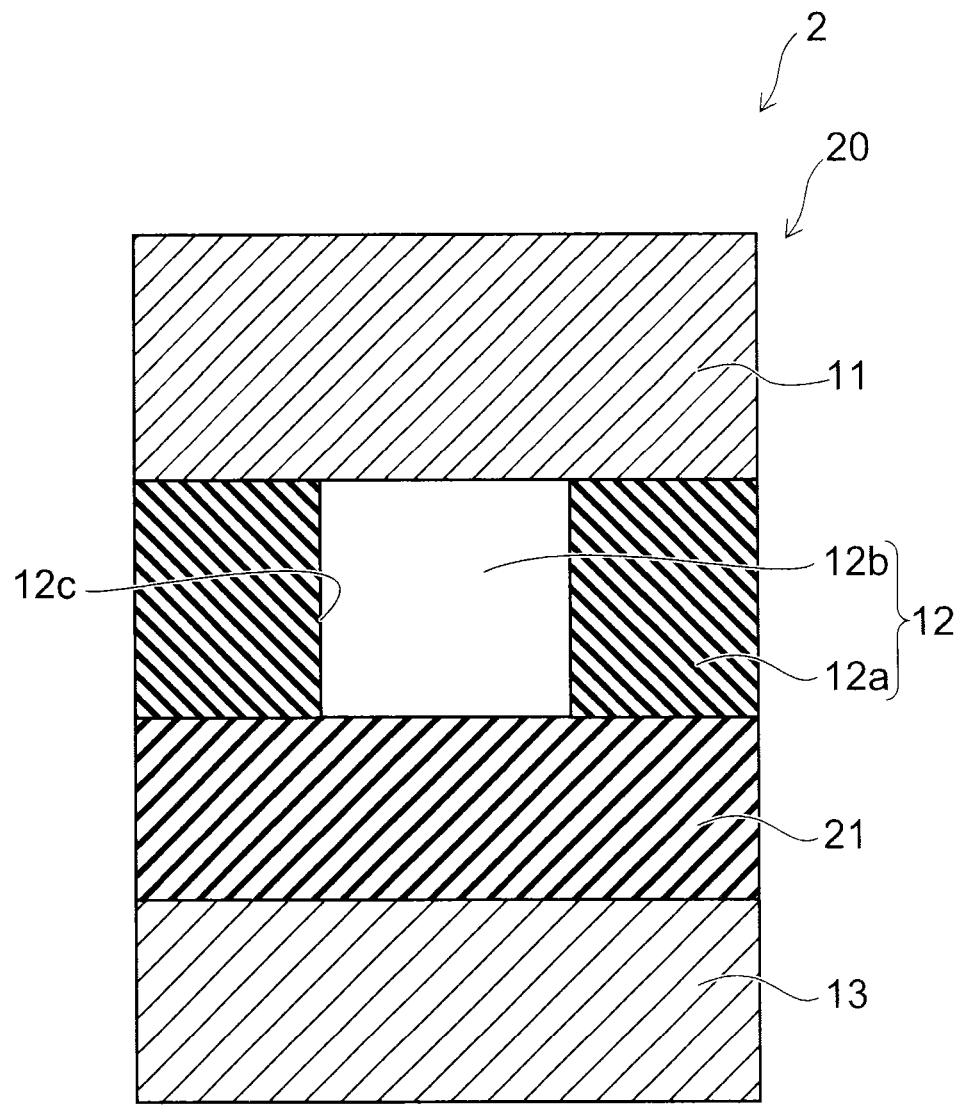
FIG. 5 is a cross-sectional view showing a memory device according to a second embodiment.

FIG. 5 is a cross-sectional view showing a memory device according to the embodiment.

In the memory device 2 according to the embodiment as shown in FIG. 5, a rectifying layer 21 is provided between the insulating layer 12 and the opposing electrode 13. The rectifying layer 21 is an insulating layer interposed between the opposing electrode 13 and the side surface 12c of the insulating portion 12a of the insulating layer 12 facing the space 12b. A resistance change element 20 is formed of the ion source electrode 11, the insulating layer 12, the rectifying layer 21, and the opposing electrode 13.

The material of the rectifying layer 21 includes an insulating material such as silicon (Si), silicon oxide (SiO), silicon nitride (SiN), silicon oxynitride (SiON), germanium (Ge), germanium oxide (GeO), germanium nitride (GeN), germanium oxynitride (GeON), etc. The material of the rectifying layer 21 may include the same material as the insulating portion 12a. Otherwise, the configuration of the embodiment is similar to that of the first embodiment described above.

Operations of the memory device 2 will now be described.

Figure 6A:
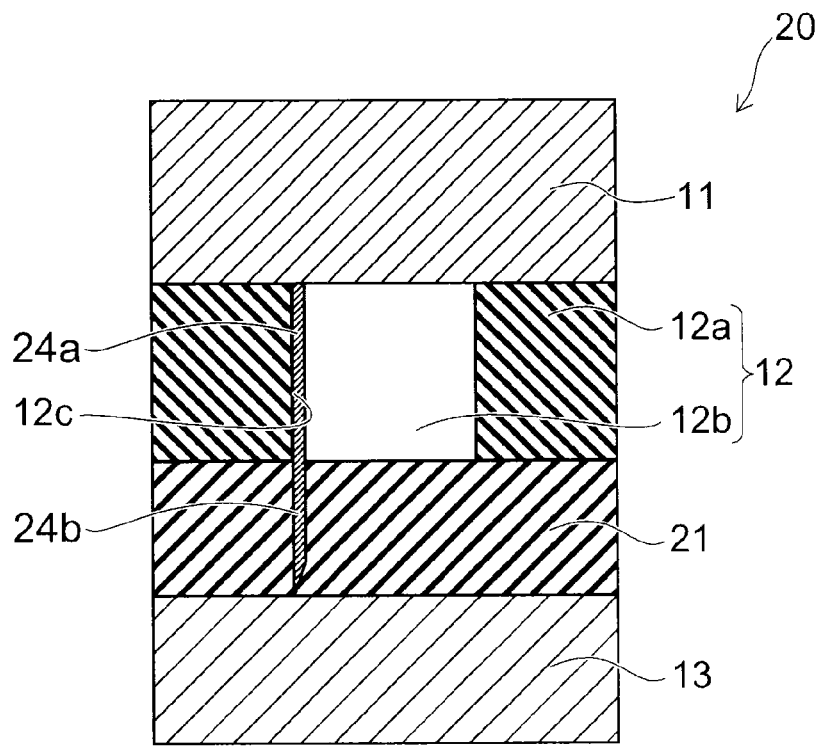
FIGS. 6A and 6B are cross-sectional views showing the operations of the memory device according to the second embodiment.
Figure 6B:
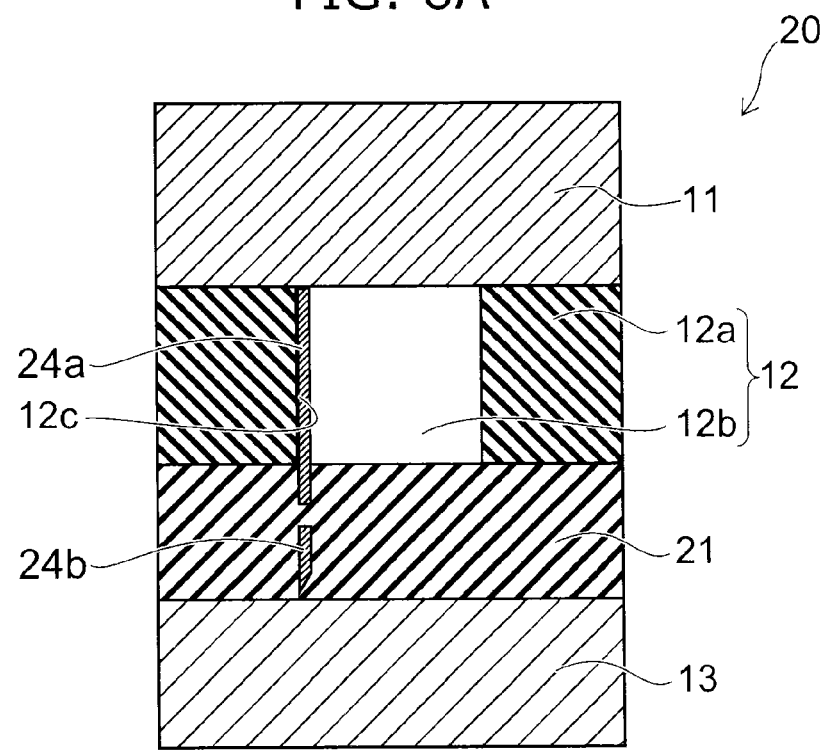

FIGS. 6A and 6B are cross-sectional views showing the operations of the memory device according to the embodiment; FIG. 6A shows a programming operation; and FIG. 6B shows an erasing operation.

As shown in FIG. 6A, a prescribed programming voltage that causes the ion source electrode 11 to be positive and the opposing electrode 13 to be negative is applied to the resistance change element 20. Thereby, a filament 24a is formed on the side surface 12c of the insulating portion 12a; and a filament 24b is formed inside the rectifying layer 21. The filament 24b is formed as an extension of the filament 24a. Then, when the tip of the filament 24b reaches the opposing electrode 13, the resistance change element 20 is switched to the low resistance state.

However, because the filament 24b that is formed inside the rectifying layer 21 is formed by pushing aside the atoms of the rectifying layer 21, the filament 24b does not toughen easily and is unstable. Therefore, as shown in FIG. 6B, at least a portion of the filament 24b disappears when the programming voltage cuts off; and the current path is broken. Thereby, the rectifying layer 21 naturally returns to the high resistance state. As a result, in the case where the resistance change elements 20 are embedded in a cross point array structure, the flow of a stray current through the resistance change elements 20 can be suppressed.

Further, because at least one portion of the filament 24b is broken, the electric field is applied easily to the broken portion of the filament 24b when the erasing voltage is applied; and the erasing operation can be realized efficiently. Restated, a material that promotes such a function, i.e., a material causing the filament that is formed to spontaneously disappear when the voltage is cut off, is used as the material of the rectifying layer 21. Otherwise, the operations of the embodiment are similar to those of the first embodiment described above.

Effects of the embodiment will now be described.

According to the embodiment as described above, the flow of the stray current through the resistance change element 20 when the resistance change element 20 is embedded in a cross point array structure can be suppressed. Otherwise, the effects of the embodiment are similar to those of the first embodiment described above.

Third Embodiment

Figure 7:
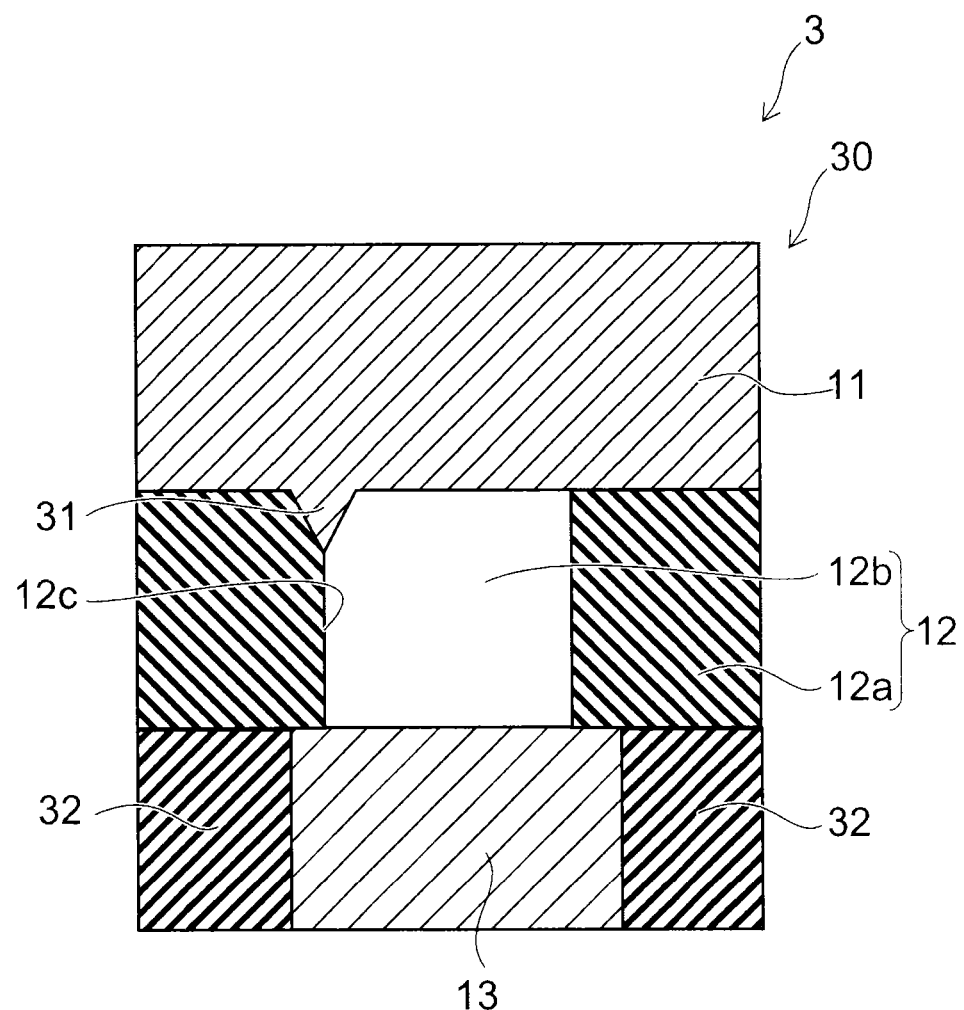
FIG. 7 is a cross-sectional view showing a memory device according to a third embodiment.

FIG. 7 is a cross-sectional view showing a memory device according to the embodiment.

In the memory device 3 according to the embodiment as shown in FIG. 7, a protruding portion 31 is provided at the triple boundary portion between the ion source electrode 11, the insulating portion 12a, and the space 12b. The protruding portion 31 is made of a conductive material, e.g., the same material as the ion source electrode 11. It is favorable for the configuration of the protruding portion 31 to be tapered toward the opposing electrode 13, e.g., a conic shape or a polygonal pyramid shape having a vertex disposed on the opposing electrode 13 side. Although it is favorable for the protruding portion 31 to be formed at only one location in the region of the side surface 12c contacting the ion source electrode 11, the protruding portion 31 may be formed in multiple locations. The ion source electrode 11 and the opposing electrode 13 have interconnect configurations and extend in mutually-orthogonal directions. An inter-layer insulating film 35 (referring to FIG. 13A) is provided between the ion source electrodes 11; and an inter-layer insulating film 32 is provided between the opposing electrodes 13. Otherwise, the configuration of the embodiment is similar to that of the first embodiment described above.

A method for manufacturing the memory device according to the embodiment will now be described.

FIG. 8A to FIG. 13B show the method for manufacturing the memory device according to the embodiment.

Figure 8A:
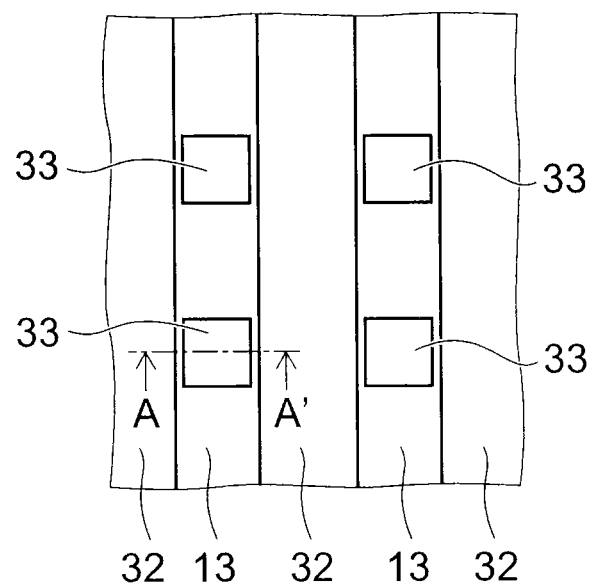
FIG. 8A to FIG. 13B show the method for manufacturing the memory device according to the embodiment.
Figure 8B:
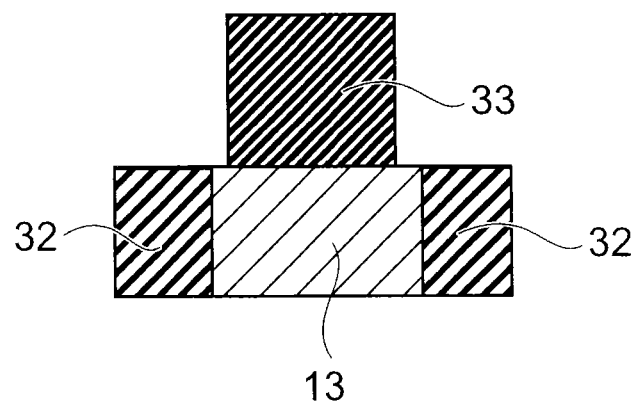

FIG. 8B is a cross-sectional view along line A-A' of FIG. 8A. This is similar for FIG. 9A to FIG. 13B.

First, as shown in FIGS. 8A and 8B, the inter-layer insulating film 32 is formed on a silicon substrate (not shown); and the opposing electrode 13 is multiply formed at the upper portion of the inter-layer insulating film 32 in interconnect configurations extending in one direction. Then, a dummy layer 33 that is made of, for example, silicon nitride is deposited above the inter-layer insulating film 32 and the opposing electrodes 13 and patterned by methods such as lithography, etc. Thereby, the dummy layer 33 is formed in a matrix configuration in multiple island configurations on the opposing electrodes 13. At this time, the widths of the dummy layers 33 are narrower than the widths of the opposing electrodes 13. Thereby, the side surfaces of the dummy layers 33 are positioned inside the opposing electrodes 13 as viewed from above.

Figure 9A:
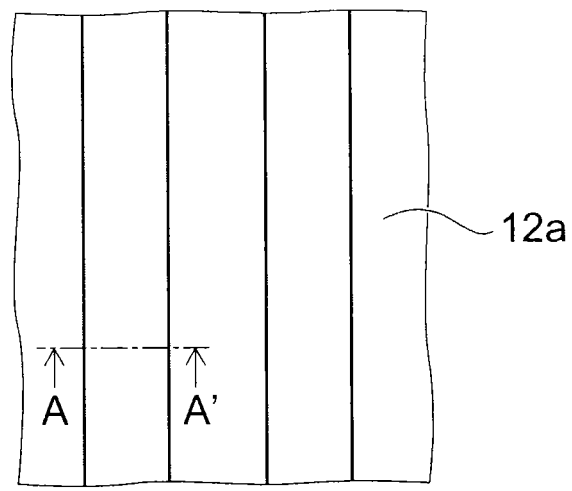
Figure 9B:
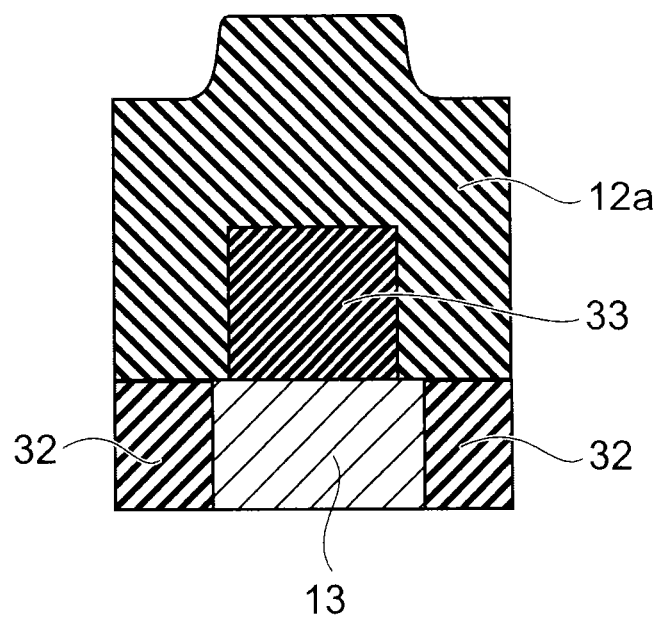

Then, as shown in FIGS. 9A and 9B, an insulating material is deposited by a method such as high-density plasma CVD (chemical vapor deposition), etc. Thereby, the insulating portion 12a is formed above the inter-layer insulating film 32 and the opposing electrodes 13 to cover the dummy layers 33.

Figure 10A:
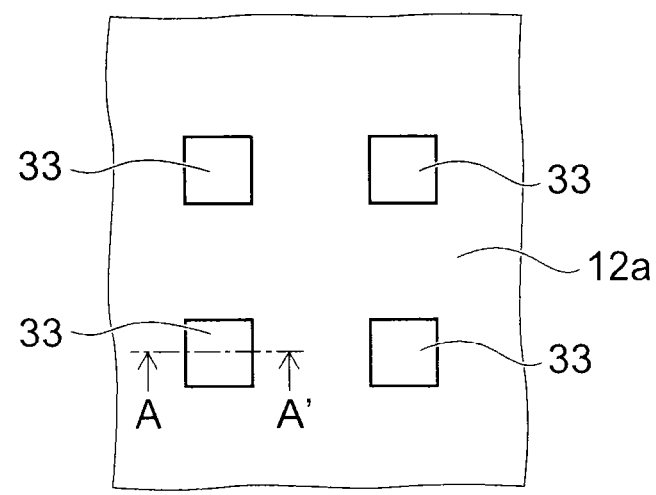
Figure 10B:
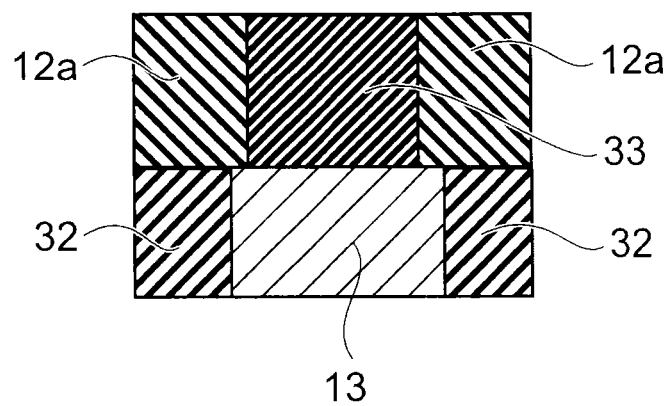

Continuing as shown in FIGS. 10A and 10B, planarization of the upper surface of the insulating portion 12a is performed by a method such as CMP (chemical mechanical polishing), etc. Thereby, the upper surfaces of the dummy layers 33 at the upper surface of the insulating portion 12a are exposed.

Figure 11A:
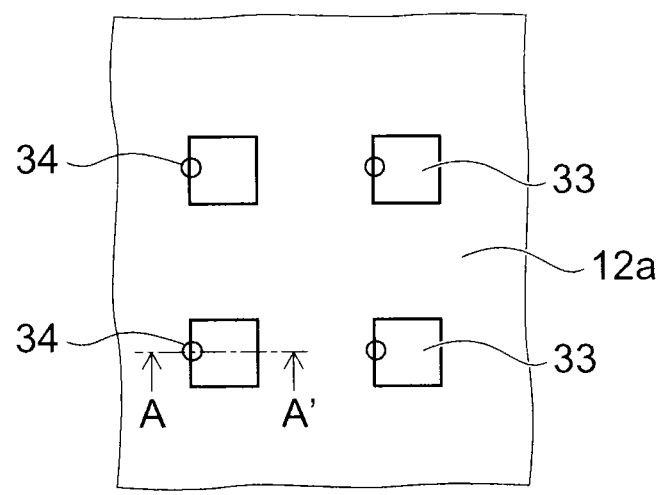
Figure 11B:
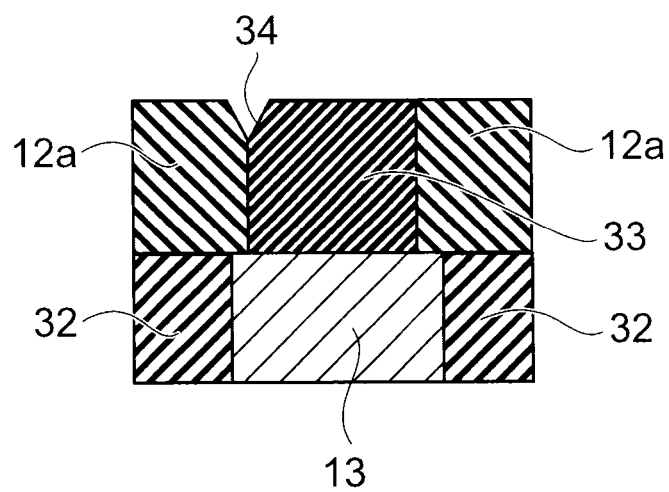

Then, as shown in FIGS. 11A and 11B, a recess 34 is made in a region including a portion of the boundary between the insulating portion 12a and the dummy layer 33 by a method such as lithography, dry etching, etc. The configuration of the recess 34 becomes finer downward and is, for example, a circular conic configuration or a pyramidal configuration.

Figure 12A:
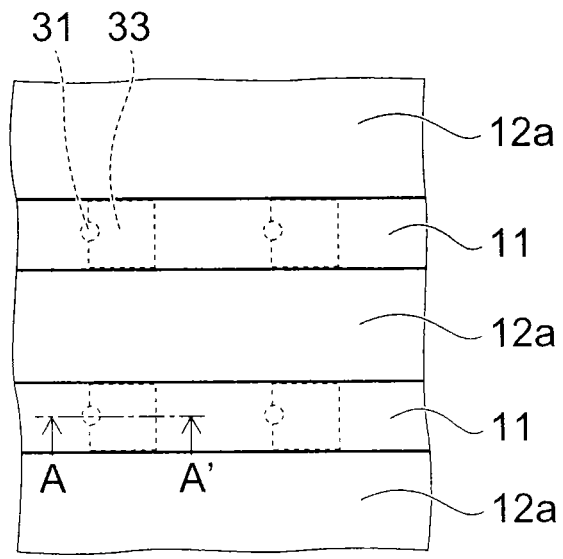
Figure 12B:
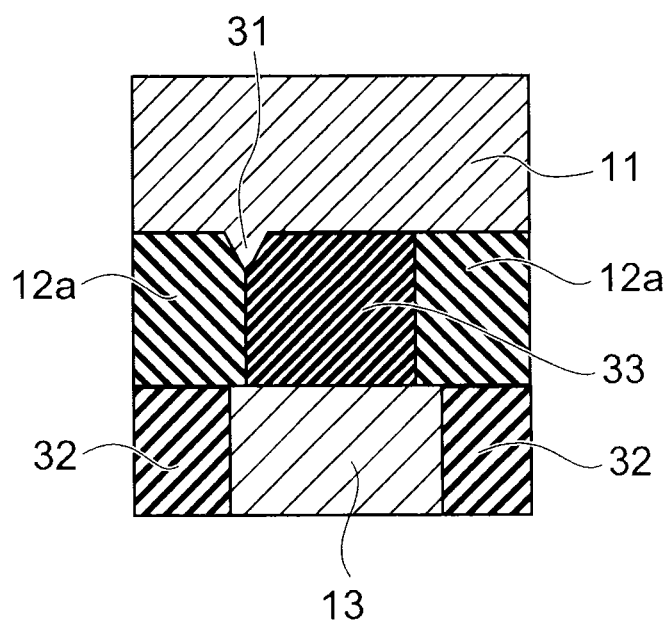

Continuing as shown in FIGS. 12A and 12B, a conductive film is formed by depositing a conductive material over the entire surface by a method such as sputtering, etc. At this time, the protruding portion 31 is formed by the conductive film also being filled into the recess 34. Then, the conductive film is selectively removed by a method such as dry etching, etc. Thereby, the ion source electrode 11 having the interconnect configuration is multiply formed. The ion source electrodes 11 extend in a direction intersecting, e.g., orthogonal to, the direction in which the opposing electrodes 13 extend. The insulating portion 12a that is in the space between the ion source electrodes 11 is removed by dry etching. The dry etching may be performed until the opposing electrodes 13 are exposed or may be stopped before the opposing electrodes 13 are exposed. Thereby, the dummy layers 33 are exposed to the outside.

Figure 13A:
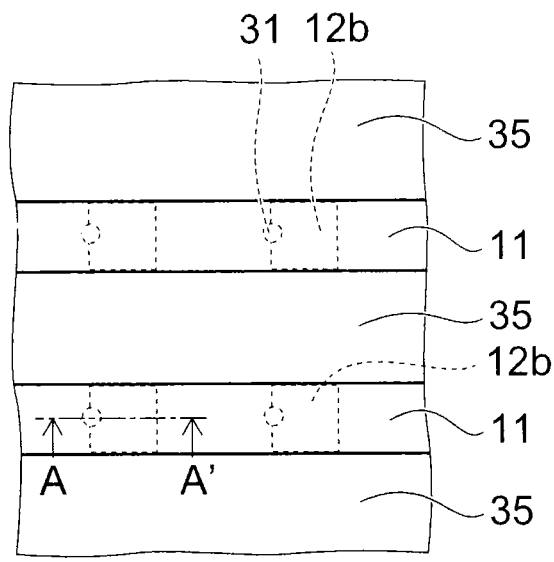
Figure 13B:
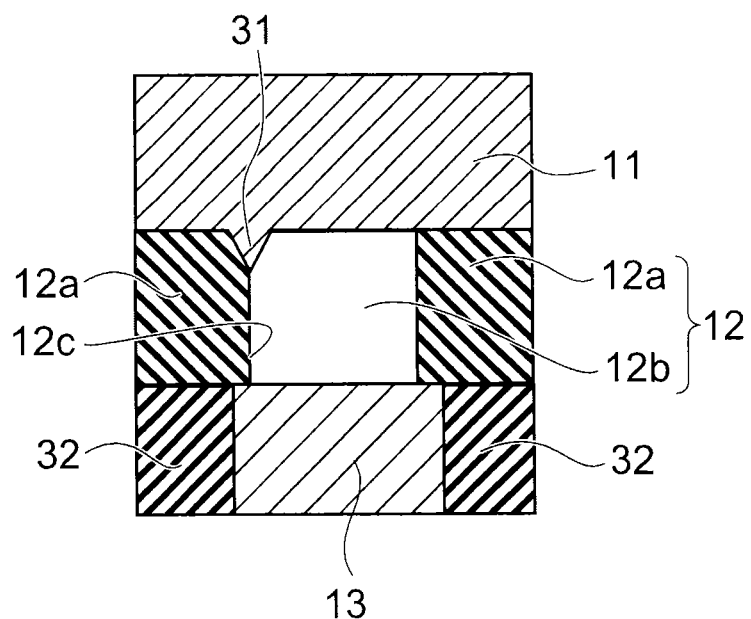

Then, as shown in FIGS. 13A and 13B, the dummy layers 33 are removed by a method such as wet etching, etc. For example, hot phosphoric acid is used as the etchant in the case where the dummy layers 33 are formed of silicon nitride. Thereby, the space from which the dummy layers 33 are removed is used as the spaces 12b. Then, the inter-layer insulating film 35 is filled between the ion source electrodes 11 such that the spaces 12b are not filled. Thus, the memory device 3 according to the embodiment is manufactured.

Effects of the embodiment will now be described.

Figure 14:
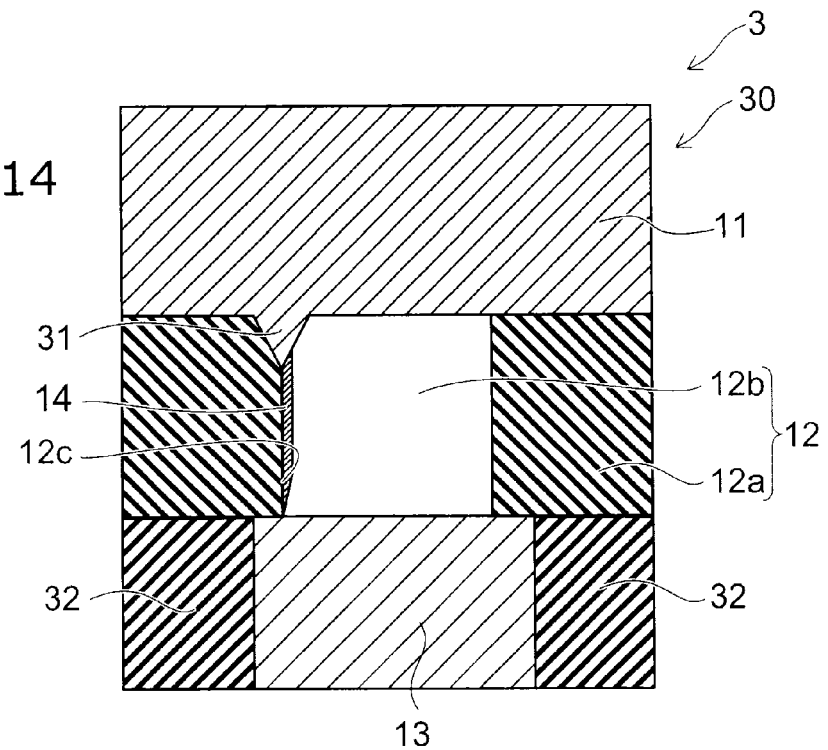
FIG. 14 is a cross-sectional view showing a programming operation of the memory device according to the third embodiment.

FIG. 14 is a cross-sectional view showing a programming operation of the memory device according to the embodiment.

In the programming operation of the embodiment as shown in FIG. 14, the filament 14 is formed with the protruding portion 31 as the starting point because the electric field concentrates at the protruding portion 31. Therefore, in the case where the programming operation is repeated, the operation is stable and there is little fluctuation in the set voltage and the on-state current during the programming operation because the filament 14 is formed in the same position each time. Also, thick and tough filaments 14 can be formed reliably because the filament 14 can be formed at the few positions where the protruding portions 31 are formed. As a result, the retention characteristics of the low resistance state are good. Otherwise, the operations and the effects of the embodiment are similar to those of the first embodiment described above.

As in the second embodiment described above, the rectifying layer 21 of the embodiment may be provided between the insulating layer 12 and the opposing electrode 13 to deter stray current.

Fourth Embodiment

Figure 15:
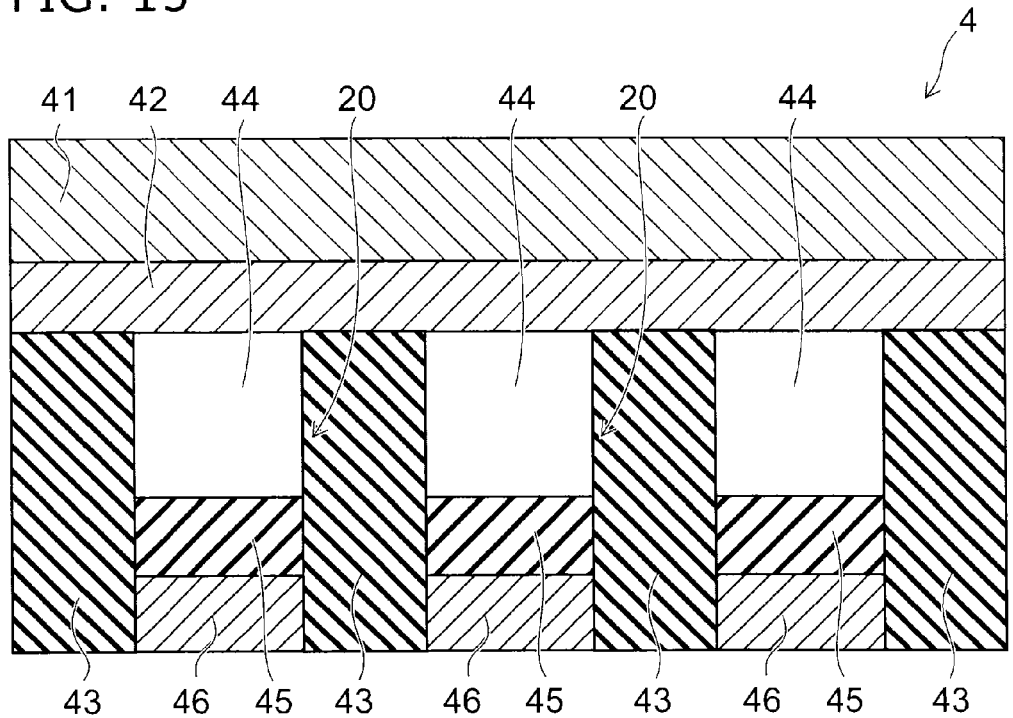
FIG. 15 is a cross-sectional view showing a memory device according to a fourth embodiment.

FIG. 15 is a cross-sectional view showing a memory device according to the embodiment.

As shown in FIG. 15, the memory device 4 according to the embodiment is an example in which the resistance change element 20 of the second embodiment described above is applied to a cross point array.

Multiple bit lines 41 that extend in one direction and multiple word lines 46 that extend in a direction intersecting, e.g., orthogonal to, the direction in which the bit lines 41 extend are provided in the memory device 4. Ion source electrodes 42 that extend in the same direction as the bit lines 41 are provided below the bit lines 41 in contact with the bit lines 41. Then, spaces 44 and rectifying layers 45 are formed at the most proximal portions between the bit lines 41 and the word lines 46. An inter-layer insulating film 43 is disposed at the portions other than the spaces 44 between the bit lines 41, between the ion source electrodes 42, between the rectifying layers 45, and between the word lines 46. The upper portions of the spaces 44 reach the ion source electrodes 42; and the lower portions of the spaces 44 reach the rectifying layers 45. Therefore, the side surfaces of the inter-layer insulating film 43 facing the spaces 44 are formed continuously from the ion source electrodes 42 to the rectifying layers 45.

Inert conductive materials that are not easily ionized such as, for example, a metal such as tungsten (W), platinum (Pt), tantalum (Ta), molybdenum (Mo), etc., or a metal nitride such as titanium nitride (TiN), tantalum nitride (TaN), tungsten nitride, etc., are used as the materials of the bit lines 41 and the word lines 46. The material of the ion source electrode 42 is similar to the material of the ion source electrode 11 of the first embodiment described above. The material of the inter-layer insulating film 43 is similar to the material of the insulating portion 12a of the first embodiment described above. The atmosphere inside the space 44 is similar to the atmosphere inside the space 12b of the first embodiment described above. The material of the rectifying layer 45 is similar to the material of the rectifying layer 21 of the second embodiment described above. The material of the rectifying layer 45 may be the same as the material of the inter-layer insulating film 43.

According to the embodiment, the bit density of the memory device 4 can be high because the resistance change element 20 can be integrated three-dimensionally. Otherwise, the configuration, the operations, and the effects of the embodiment are similar to the second embodiment described above.

Although an example is illustrated in the embodiment in which the resistance change element 20 of the second embodiment is applied to a cross-point structure, the resistance change element 10 of the first embodiment and the resistance change element 30 of the third embodiment are applicable to cross-point structures.

According to the embodiments described above, a memory device having stable operations can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device, comprising:
   a first electrode including an ionizable metal;
   a second electrode including a conductive material, the conductive material being more difficult to ionize than the metal; and
   an insulating portion provided between the first electrode and the second electrode, the insulating portion being made of an insulating material,
   a space being adjacent to a side surface of the insulating portion between the first electrode and the second electrode.

2. The device according to claim 1, wherein the insulating material includes silicon and nitrogen.

3. The device according to claim 1, wherein the first electrode includes at least one type of metal material selected from the group consisting of silver, copper, nickel, cobalt, titanium, aluminum, and gold.

4. The device according to claim 1, further comprising an insulating layer interposed between the second electrode and the side surface of the insulating portion facing the space.

5. The device according to claim 4, wherein the insulating layer includes silicon or germanium.

6. The device according to claim 1, wherein a filament is formed from the first electrode toward the second electrode on the side surface of the insulating portion facing the space when a voltage is applied to cause the first electrode to be positive and the second electrode to be negative.

7. A memory device, comprising:
   a first electrode including silver;
   a second electrode; and
   an insulating portion provided between the first electrode and the second electrode, the insulating portion being made of silicon oxide including nitrogen,
   a space being adjacent to a side surface of the insulating portion between the first electrode and the second electrode.

8. The device according to claim 7, wherein a filament is formed from the first electrode toward the second electrode on the side surface of the insulating portion facing the space when a voltage is applied to cause the first electrode to be positive and the second electrode to be negative.

9. A memory device, comprising:
   a first conductive line extending in a first direction;
   a second conductive line extending in a second direction intersecting the first direction;
   an electrode disposed between the first conductive line and the second conductive line, the electrode including an ionizable metal;
   an insulating layer provided between the electrode and the second conductive line; and
   an insulating portion provided between the electrode and the insulating layer, the insulating portion being made of an insulating material,
   a space being made adjacent to a side surface of the insulating portion between the electrode and the insulating layer.

10. The device according to claim 9, wherein the insulating material includes silicon and nitrogen.

11. The device according to claim 9, wherein the electrode includes at least one type of metal material selected from the group consisting of silver, copper, nickel, cobalt, titanium, aluminum, and gold.

12. The device according to claim 9, wherein the insulating layer includes silicon or germanium.

13. The device according to claim 9, wherein a filament is formed from the electrode side on the side surface of the insulating portion facing the space when a voltage is applied to cause the first conductive line to be positive and the second conductive line to be negative.

* * * * *